(12) United States Patent
Yang

(10) Patent No.: US 9,786,723 B2
(45) Date of Patent: Oct. 10, 2017

(54) PIXEL CIRCUIT, DRIVING METHOD THEREOF AND DISPLAY APPARATUS

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventor: Shengji Yang, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 0 days.

(21) Appl. No.: 14/775,027

(22) PCT Filed: Nov. 28, 2014

(86) PCT No.: PCT/CN2014/092554
§ 371 (c)(1),
(2) Date: Sep. 11, 2015

(87) PCT Pub. No.: WO2016/029577
PCT Pub. Date: Mar. 3, 2016

(65) Prior Publication Data
US 2016/0204166 A1     Jul. 14, 2016

(30) Foreign Application Priority Data

Aug. 26, 2014   (CN) .......................... 2014 1 0425976

(51) Int. Cl.
*H01L 27/32*     (2006.01)
*G06F 3/041*     (2006.01)
(Continued)

(52) U.S. Cl.
CPC ............ *H01L 27/323* (2013.01); *G06F 3/042* (2013.01); *G06F 3/044* (2013.01); *G06F 3/0416* (2013.01);
(Continued)

(58) Field of Classification Search
CPC ........ G06F 3/0416; G06F 3/042; G06F 3/044; G09G 2310/0251; G09G 2320/0233;
(Continued)

(56) References Cited

U.S. PATENT DOCUMENTS 7,872,620 B2 *   1/2011  Han ..................... G09G 3/3258
                                                        345/82
8,289,313 B2 *  10/2012  Lee ..................... G09G 3/3233
                                                       315/169.3

(Continued)

FOREIGN PATENT DOCUMENTS

CN          102455538 A       5/2012
CN          103208255 A       7/2013
(Continued)

OTHER PUBLICATIONS

First Chinese Office Acion dated Dec. 15, 2015; Appln. No. 201410425976.3.

(Continued)

*Primary Examiner* — Afroza Chowdhury
(74) *Attorney, Agent, or Firm* — Ladas & Parry LLP

(57) ABSTRACT

A pixel circuit includes a display unit and a touch control unit. The display unit includes a light-emitting element, a storage capacitor, a driving transistor for using the data signal stored in the storage capacitor to drive a light-emitting element (11) to emit light, a power switch module for inputting an operating voltage into the driving transistor, a precharging module for charging a control terminal of the driving transistor, and a compensation module for compen-
(Continued)

sating a data signal and write the compensated data signal into the storage capacitor. The touch control unit includes an initialization module for initializing the touch control module while the precharging module is operating, a touch control module for collecting touch control signals in corresponding regions, and an output control module for closing an output path to output the touch control signals collected by the touch control module which the compensation module is operating.

16 Claims, 6 Drawing Sheets

(51) Int. Cl.
G06F 3/042 (2006.01)
G09G 3/32 (2016.01)
G06F 3/044 (2006.01)
G09G 3/3258 (2016.01)
G09G 3/3225 (2016.01)

(52) U.S. Cl.
CPC ......... *G09G 3/3225* (2013.01); *G09G 3/3258* (2013.01); *G09G 2300/0814* (2013.01); *G09G 2300/0819* (2013.01); *G09G 2300/0842* (2013.01); *G09G 2300/0861* (2013.01); *G09G 2310/0251* (2013.01); *G09G 2310/08* (2013.01); *G09G 2320/0233* (2013.01); *G09G 2320/0626* (2013.01)

(58) Field of Classification Search
CPC ............. G09G 2320/0626; G09G 3/32; G09G 3/3258; H01L 27/323
See application file for complete search history.

(56) References Cited

U.S. PATENT DOCUMENTS

| 9,367,164 B2* | 6/2016 | Wu ........................ G09G 3/3233 |
| 2007/0040772 A1 | 2/2007 | Kim |
| 2010/0164847 A1* | 7/2010 | Lee ........................ G09G 3/3233 345/77 |
| 2011/0001711 A1 | 1/2011 | Choi et al. |
| 2011/0141160 A1* | 6/2011 | Nathan ................ G09G 3/3233 345/690 |
| 2014/0198076 A1* | 7/2014 | Layton .................. G06F 3/0416 345/174 |
| 2014/0232623 A1 | 8/2014 | Nathan et al. |
| 2015/0302801 A1 | 10/2015 | Tan et al. |
| 2016/0005356 A1 | 1/2016 | Zhang |
| 2016/0103513 A1* | 4/2016 | Yang ....................... G06F 3/041 345/175 |

FOREIGN PATENT DOCUMENTS

| CN | 103218972 A | 7/2013 |
| CN | 103354078 A | 10/2013 |
| CN | 103354079 A | 10/2013 |
| CN | 103488325 A | 1/2014 |
| CN | 103531151 A | 1/2014 |
| CN | 103996377 A | 8/2014 |
| JP | 2011-002606 A | 1/2011 |
| KR | 20110003187 A | 1/2011 |

OTHER PUBLICATIONS

International Search Report Appln. No. PCT/CN2014/092554; Dated Jun. 1, 2015.
Written Opinion of the International Searching Authority Appln. No. PCT/CN2014/092554; Dated Jun. 1, 2015.

* cited by examiner

PIXEL CIRCUIT, DRIVING METHOD THEREOF AND DISPLAY APPARATUS

TECHNICAL FIELD OF THE DISCLOSURE

The present disclosure relates to a pixel circuit, a driving method thereof, and a display apparatus.

BACKGROUND

The OLED (Organic Light Emitting Diode) as a current type light emitting device is more and more applied to high performance display areas due to its characteristics such as self light emitting, fast response, wide angle of view and ability of being fabricated on a flexible substrate.

Different from liquid crystal displays which use stable voltage to control brightness, OLED is current-driven, and needs a stable current to control light emitting. For OLED display, how to address the impact of the threshold voltage shift is one of the concerns that need to be focus on when designing pixel circuits.

Meanwhile, in recent years, the touch control function is more and more widely applied in various display panels, especially in mobile display, and has almost become the standard configuration for smart phones. Accordingly, OLED display panels with touch control functions have been more and more popular in people of all ages. But now, in the known art, the display panel and TSP (touch screen panel) are often fabricated separately, and then jointed together. Such a procedure causes the process of the display panel with touch screen to be complex and of high cost, and is not advantageous for the lightness and thinness of display. TSP in cell (TSP built-in) technology integrates the display function and the touch control function, which uses one process, instead of two divided processes, to complete. Therefore, it not only has the advantage of low cost, but also makes the process simple and the display touch panel more light and thin. But as to how to perfectly integrate the touch control circuit with the pixel circuit, there is still no good solution.

SUMMARY

In one aspect, an embodiment of the present disclosure provides a pixel circuit comprising a display unit and a touch control unit, wherein the display unit comprises a light-emitting element, a driving transistor, a storage capacitor, a power switch module, a precharging module and a compensation module, the precharging module is configured to charge a control terminal of the driving transistor, and maintain the state under the effect of the storage capacitor, so that a conduction state is maintained between the compensation module and the storage capacitor; the compensation module is configured to compensate a data signal and write the compensated data signal into the storage capacitor; the power switch module is configured to input an operating voltage into the driving transistor after the data signal is written into the storage capacitor; the driving transistor is configured to use the data signal stored in the storage capacitor to drive the light-emitting element to emit light.

The touch control unit comprises an initialization module, a touch control module and an output control module, wherein the initialization module is configured to initialize the touch control module while the precharging module is operating; the touch control module is configured to collect touch control signals in corresponding regions; the output control module is configured to close an output path to output the touch control signals collected by the touch control module while the compensation module is operating.

Optionally, one terminal of the light-emitting element is connected to a grounded terminal, and the other terminal of the light-emitting element is connected to a second terminal of the driving transistor; a first terminal of the driving transistor is connected to a second terminal of the power switch module, and a control terminal of the driving transistor is connected to a first terminal of the storage capacitor; a first terminal of the power switch module is connected to an input terminal for the operating voltage, and a light emitting control signal is inputted into a control terminal of the power switch module; a second terminal of the storage capacitor is connected to the grounded terminal; the precharging module is connected to the second terminal of the power switch module, the control terminal of the driving transistor and a first control signal line; the compensation module is connected to a data signal line, the control terminal of the driving transistor and a second control signal line.

Optionally, the initialization module is connected to an input terminal of the touch control module, the first control signal line and an initialization signal line; the output control module is connected to an output terminal of the touch control module, the second control signal line and a signal read line.

Optionally, the touch control module is a photo-sensitive touch control module or a capacitive touch control module.

Optionally, the touch control module comprises a photo-sensitive transistor and a first capacitor, wherein a first terminal of the photo-sensitive transistor is connected to a control terminal of the photo-sensitive transistor and a first terminal of the first capacitor, and is connected to the initialization module as the input terminal of the touch control module; a second terminal of the photo-sensitive transistor is connected to a second terminal of the first capacitor, and is connected to the output control module as the output terminal of the touch control module.

Optionally, the touch control module comprises a first transistor and a second capacitor, wherein a control terminal of the first transistor is connected to a first terminal of the second capacitor, and is connected to the initialization module as the input terminal of the touch control module, a second terminal of the first transistor is connected to the output control module as the output terminal of the touch control module, a first terminal of the first transistor and a second terminal of the second capacitor are both connected to a common voltage input terminal.

Optionally, the initialization module is a second transistor, and the output control module is a third transistor.

Optionally, the compensation module comprises a fourth transistor and a fifth transistor, a first terminal of the fourth transistor is connected to the data signal line, a second terminal of the fourth transistor is connected to a first terminal of the fifth transistor, a control terminal of the fourth transistor is connected to the second control signal line; a second terminal of the fifth transistor is connected to a control terminal of the fifth transistor and connected to the control terminal of the driving transistor.

Optionally, the precharging module is a sixth transistor, and the power switch module is a seventh transistor.

Optionally, all the transistors have the same channel type.

Optionally, the channel type of the seventh transistor is opposite to that of the fourth transistor, a control terminal of the seventh transistor is connected to the second control signal line.

An embodiment of the present disclosure also provides a display apparatus comprising any of the above pixel circuits.

In another aspect, an embodiment of the present disclosure also provides a driving method of a pixel circuit, comprising a precharging module charging a control terminal of a driving transistor, so that the potential of the control terminal becomes an operating voltage, the state is maintained under the effect of a storage capacitor, a conduction state is maintained between a compensation module and the storage capacitor, and meanwhile an initialization module in an touch control unit initializes a touch control module; a compensation module compensating a data signal, loading the compensated data signal onto the control terminal of the driving transistor and writing the same into the storage capacitor, and meanwhile an output control module in the touch control unit closing an output path to output the touch control signals collected by the touch control unit to a signal read line; turning off the touch control unit while a power switch module is turned on, inputting the operating voltage into the driving transistor, and the driving transistor using the data signal stored in the storage capacitor to drive a light-emitting element to emit light.

Embodiments of the present disclosure provide a pixel circuit and a driving method thereof, and a display apparatus. The pixel circuit comprises a display unit and a touch control unit, wherein the display unit comprises a light-emitting element, a driving transistor, a storage capacitor, a power switch module, a precharging module and a compensation module; and the touch control unit comprises an initialization module, a touch control module and an output control module. The operating process of the display unit comprises three phases which are a precharging phase, a loading phase and a driving and light-emitting phase. In the precharging phase, a precharging module charges a control terminal of the driving transistor, so that the potential of the control terminal becomes an operating voltage and the state is maintained under the effect of a storage capacitor, and an output path is closed between a compensation module and the control terminal of the driving transistor; in the loading phase, a compensation module compensates a data signal and writes the compensated data signal into the storage capacitor; in the driving and light-emitting phase, the data signal voltage stored in the storage capacitor is used to drive a light-emitting element to emit light. While the display unit is operating, the touch control unit in the embodiments of the present disclosure simultaneously operates as follows: in the precharging phase, an initialization module in an touch control unit initializes a touch control module; in the loading phase, the output control module is turned on, the touch control unit collects and outputs touch control signals in corresponding regions; in the driving and light-emitting phase, the touch control unit is turned off.

DETAILED DESCRIPTION

Figure 1:
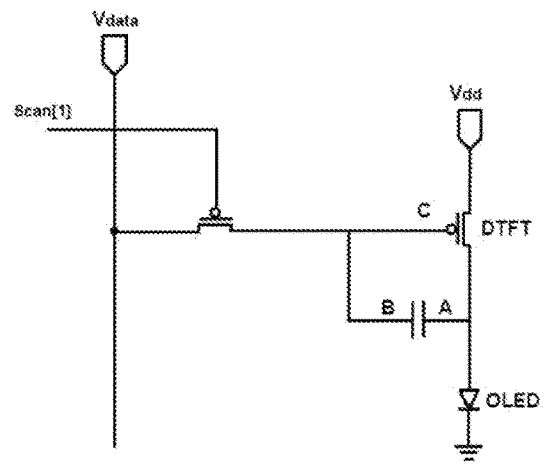
FIG. 1 is a schematic diagram of an original pixel circuit with 2T1C.

FIG. 1 is a schematic diagram of an original pixel circuit with 2T1C. In the original pixel circuit with 2T1C, $I_{OLED}$ is a current resulting from signal Vdata functioning in the saturation region of driving thin film transistor (DTFT). It drives OLED to emit light, and the formula is $I_{OLED}=K(V_{GS}-V_{th})^2$, wherein $V_{GS}$ is a voltage difference between the gate and the source, $V_{GS}$=Vdata−Vdd, Vdd being a constant operating voltage, and $V_{th}$ is the threshold voltage of DTFT. For a better display effect, it requires that $I_{OLED}$ is only related to Vdata, but in fact threshold voltages ($V_{th}$) of DTFTs at respective pixels lack uniformity due to the process technology and device aging and other reasons (known as threshold voltage drift problem). It has thus caused that the current flowing through OLED at each pixel varies with $V_{th}$, thereby affecting the display effect of the entire image.

Hereinafter, detailed and clear descriptions will be made to the technical solutions in the embodiments of the present disclosure in connection with the accompany drawings. Apparently, the embodiments described are only part of but not all of the embodiments of the present disclosure.

Figure 2:
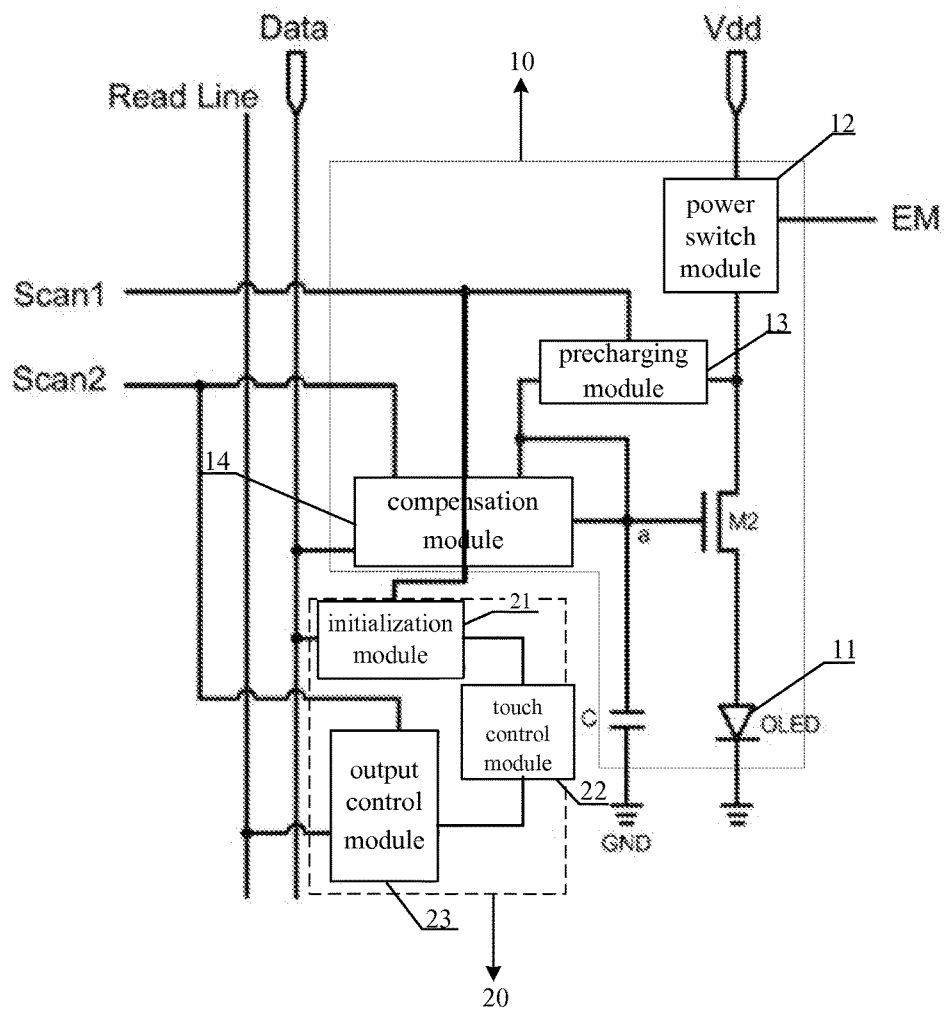
FIG. 2 is a schematic diagram of a pixel circuit provided by an embodiment of the present disclosure.

An embodiment of the present disclosure provides a pixel circuit. As shown in FIG. 2, the pixel circuit comprises a display unit 10 and a touch control unit 20. The display unit 10 comprises a light-emitting element 11 (such as the OLED in FIG. 2), a driving transistor M2, a storage capacitor C, a power switch module 12, a precharging module 13 and a compensation module 14. The precharging module 13 is configured to charge a control terminal of the driving transistor M2, and maintain the state under the effect of the storage capacitor C, so that a conduction state is maintained between the compensation module 14 and the storage capacitor C. The compensation module 14 is configured to compensate a data signal and write the compensated data signal into the storage capacitor C. The power switch module 12 is configured to input an operating voltage into the driving transistor M2 after the data signal is written into the storage capacitor C. The driving transistor M2 is configured to use the data signal stored in the storage capacitor C to drive the light-emitting element 11 to emit light.

The touch control unit 20 comprises an initialization module 21, a touch control module 22 and an output control module 23. The initialization module 21 is configured to initialize the touch control module 22 while the precharging module 13 is operating. The touch control module 22 is configured to collect touch control signals in corresponding regions. The output control module 23 is configured to close an output path to output the touch control signals collected by the touch control module 22 while the compensation module 14 is operating.

The operating process of the display unit 10 of the pixel circuit provided by the embodiment comprises three phases which are a precharging phase, a signal loading phase and a driving and light-emitting phase. In the precharging phase, the precharging module 13 charges a control terminal of the driving transistor M2, for example, to pull up the potential of the control terminal, so that a conduction state is maintained among the compensation module 14, the control terminal of the driving transistor M2 and the storage capacitor C, and the conduction state is maintained until the next phase, i.e., until after a data signal is written into the storage capacitor C, due to the maintaining effect of the storage capacitor C. In the signal loading phase, the compensation module 14 compensates the data signal and writes the compensated data signal into the storage capacitor C. In the driving and light-emitting phase, the power switch module 12 is turned on, an operating voltage is inputted into the driving transistor M2, and the driving transistor M2 uses the data signal stored in the storage capacitor C to drive a light-emitting element 11 to emit light. While the display unit 10 is operating, the touch control unit 20 simultaneously operates as follows. In the precharging phase in which the display unit 10 is operating, the initialization module 21 in the touch control unit 20 in the present embodiment initializes a touch control module 22. In the signal loading phase in which the display unit 10 is operating, the output control module 23 is turned on, and the touch control signals collected by the touch control module 22 are outputted to the outside. In the driving and light-emitting phase in which the display unit 10 is operating, the initialization module 21 and the output control module 23 is cut off from the connection with the outside and the touch control unit 20 is turned off.

In summary, the pixel circuit provided by the embodiment of the present disclosure can not only compensate for the threshold voltage shift of the driving transistor, and improve the uniformity of brightness of the display panel, but can also integrate the functions of light-emitting display and touch control together without increasing the complexity of the circuit structure and operation, achieving the purpose of simplifying operations and manufacturing processes. Display panels or devices using the above-mentioned pixel circuit can achieve the functions of light-emitting display and touch control simultaneously.

For example, in an optional implementation, one terminal of the light-emitting element 11 is connected to a grounded terminal GND, and the other terminal of the light-emitting element 11 is connected to a second terminal of the driving transistor M2; a first terminal of the driving transistor M2 is connected to a second terminal of the power switch module 12; a first terminal of the power switch module 12 is connected to an input terminal Vdd for the operating voltage, a light emitting control signal EM is inputted into a control terminal of the power switch module 12; a first terminal of the storage capacitor C is connected to a control terminal (node a) of the driving transistor M2, a second terminal of the storage capacitor C is connected to the grounded terminal GND; the precharging module 13 is configured to charge the control terminal (node a) of the driving transistor M2, and is connected to the second terminal of the power switch module 12, the control terminal of the driving transistor M2 and a first control signal line Scan1 and the compensation module 14; the compensation module 14 is configured to compensate a data signal and write the compensated data signal into the storage capacitor C, and is connected to a data signal line Data, the control terminal of the driving transistor M2 and a second control signal line Scan2.

The touch control unit 20 is configured to realize the touch control function and comprises an initialization module 21, a touch control module 22 and an output control module 23. The initialization module 21 is connected to an input terminal of the touch control module 22, the first control signal line Scan1 and an initialization signal line (the data signal line Data in the Figure). The initialization module 21 is configured to use the signal Data to initialize the touch control module 22 under the control of the first control signal line Scan1. The output control module 22 is configured to collect touch control signals in corresponding regions. The output control module 23 is connected to an output terminal of the touch control module 22, the second control signal line Scan2 and a signal read line Read Line, and the output control module 23 is configured to output the touch control signals collected by the touch control module 22 to the signal read line Read Line under the control of the second control signal line Scan2. Optionally, the touch control module 22 is a photo-sensitive touch control module or a capacitive touch control module, the initialization module 21 is a second transistor N2, and the output control module 23 is a third transistor N3.

The pixel circuit provided in the embodiment of the present disclosure integrates the display unit 10 which drives to emit light to realize display function and the touch control unit 20 which realizes the function of touch control together in a way of reusing signal lines, thereby realizing the efficient integration of AMOLED display and touch control function.

As for the display unit 10, in the present embodiment, a power switch module 12 is provided at the operating voltage input terminal Vdd and is controlled by using the light emitting control signal EM, which can on one hand control the light-emitting time of light-emitting element 11, and on the other hand use the operating voltage (operating voltage is the voltage at the operating voltage input terminal) to charge and reset the control terminal of the driving transistor M2 and terminal of the storage capacitor C where it connects with the control terminal, eliminating the effects of the signal of the previous frame. This aim is achieved by the cooperation of the precharging module 13 and the power switch module 12 and under the control of the first control signal line Scan1, known as the precharging phase of the display unit 10. After the precharging phase is completed, the compensation module 14 compensates a data signal and writes the compensated data signal into the storage capacitor C under the control of the second control signal line Scan2, and this phase is known as the signal loading phase of the display unit 10. After the signal loading phase is completed, the power switch module 12 is turned on under the control of the light emitting control signal EM, an operating voltage is inputted into the first terminal of the driving transistor M2, and the data signal stored in the storage capacitor C drives the light-emitting element 11 to emit light and realize display. It can be seen from the above operating process that the display unit 10 can realize the functions of reset and compensation.

The above pixel circuit further comprises the touch control unit 20 configured to realize the function of touch control. The touch control unit 20 and the display unit 10 share the first control signal line Scan1 and the second control signal line Scan2. In the precharging phase of the display unit 10, the initialization module 21 of the touch control unit 20 initializes the touch control module 22 under the control of the first control signal line Scan1. In the signal loading phase of the display unit 10, the output control module 23 is turned on under the control of the second control signal line Scan2, and the touch control signals collected by the touch control module 22 are outputted to the signal read line Read Line. In the driving and light-emitting phase of the display unit 10, the touch control unit 20 is turned off so as to avoid affecting the display unit 10. In order to reduce the number of the signal lines, the data signal or the operating voltage signal can be directly used when initializing the touch control unit 20, that is, an initial signal line may not be provided, the touch control unit 20 can be directly connected to the data signal line Data or the operating voltage input terminal Vdd.

The pixel circuit provided by the embodiment of the present disclosure can not only compensate for the threshold voltage shift of the driving transistor and improve the uniformity of brightness of the display panel, but can also integrate the functions of light-emitting display and touch control together without increasing the complexity of the circuit structure and operation, achieving the purpose of simplifying operations and manufacturing processes. Display panels or devices using the above-mentioned pixel circuit can achieve the functions of light-emitting display and touch control simultaneously.

Figure 3:
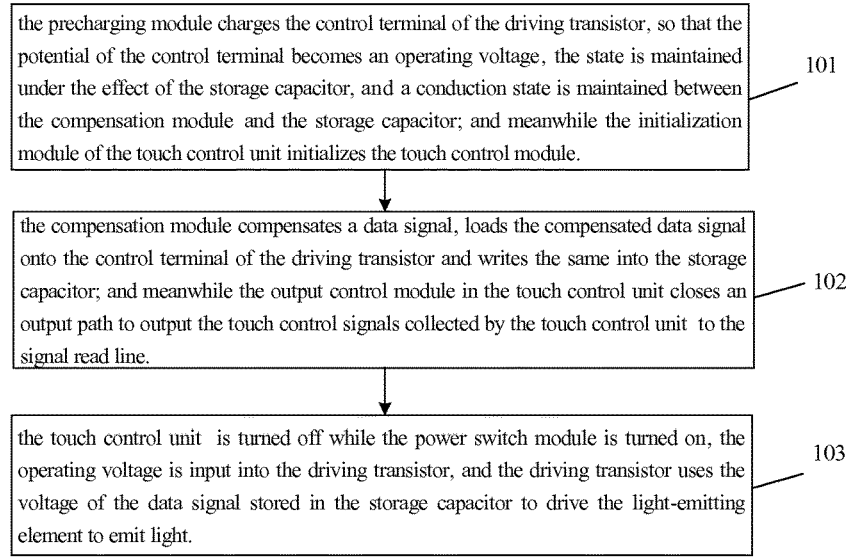
FIG. 3 is a flowchart of a driving method of a pixel circuit provided by an embodiment of the present disclosure.

An embodiment of the present disclosure also provides a driving method of the above pixel circuit. As shown in FIG. 3, the method comprises the following steps.

At step 101, the precharging module 13 charges the control terminal of the driving transistor M2, so that the potential of the control terminal becomes an operating voltage, the state is maintained under the effect of the storage capacitor C, a conduction state is maintained between the compensation module 14 and the storage capacitor C, and meanwhile the initialization module in the touch control unit 20 initializes the touch control module.

The pixel circuit of the present embodiment comprises the display unit 10 and the touch control unit 20. The operating process of the display unit 10 comprises three phases which are a precharging phase, a signal loading phase and a driving and light-emitting phase. The above step is the precharging phase of the display unit 10 in which the precharging module 13 and the power switch module 12 cooperates with each other to charge the control terminal of the driving transistor M2 so that the potential of the control terminal is reset as an operating voltage. In this way, on one hand, the control terminal of the driving transistor M2 and the storage capacitor C to which the control terminal is connected are reset to avoid the influence of the signal of the previous frame; on the other hand, the potential of the control terminal is pulled up so that a conduction state is maintained among the compensation module 14, the control terminal of the driving transistor M2 and the storage capacitor C, and the conduction state is maintained until the next phase, i.e., until after a data signal is written into the storage capacitor C, due to the maintaining effect of the storage capacitor C.

For example, in this step, the precharging module 13 uses the operating voltage signal to charge the control terminal (i.e., node a) of the driving transistor M2 under the control of the first control signal line Scan1. Meanwhile, the initialization module 21 in the touch control unit 20 uses a data signal to initialize the touch control module 22 under the control of the first control signal line Scan1. The data signal line Data in FIG. 2 also acts as an initialization signal line.

At step 102, the compensation module 14 compensates a data signal, loads the compensated data signal onto the control terminal of the driving transistor M2, writes the same into the storage capacitor C, and meanwhile the output control module 23 in the touch control unit 20 closes an output path to output the touch control signals collected by the touch control unit 22 to the signal read line Read line.

In this step, the compensation module 14 writes the compensated data signal into the storage capacitor C under the control of the second control signal line Scan2. The output control module 23 in the touch control unit 20 is turned on under the control of the second control signal line Scan2, and the touch control unit 20 collects touch control signals in corresponding regions and outputs them to the signal read line Read line. This step corresponds to the signal loading phase of the display unit 10 and a collecting and outputting phase of the touch control unit 20.

At step 103, the touch control unit 20 is turned off while the power switch module 12 is turned on, the operating voltage is input into the driving transistor M2, and the driving transistor M2 uses the voltage of the data signal stored in the storage capacitor C to drive the light-emitting element 11 to emit light.

In this step, the touch control unit 20 is cut off from the other modules under the control of Scan1 and Scan2, and the touch control unit 20 is in a turned-off state. Whereas in the display unit 11, the power switch module 12 is turned on, so that the operating voltage is input into the first terminal of the driving transistor M2, and the driving transistor M2 uses the data signal stored in the storage capacitor C to drive the light-emitting element 11 to emit light and realize display. This corresponds to the driving and light-emitting phase of the display unit 10.

The pixel circuit and the driving method thereof provided by the embodiments of the present disclosure can not only compensate for the threshold voltage shift of the driving transistor and improve the uniformity of brightness of the OLED display panel, but can also integrate the touch control unit into the pixel circuit without increasing the complexity of the circuit structure and operation, achieving the purpose of simplifying operations and manufacturing processes.

Figure 4:
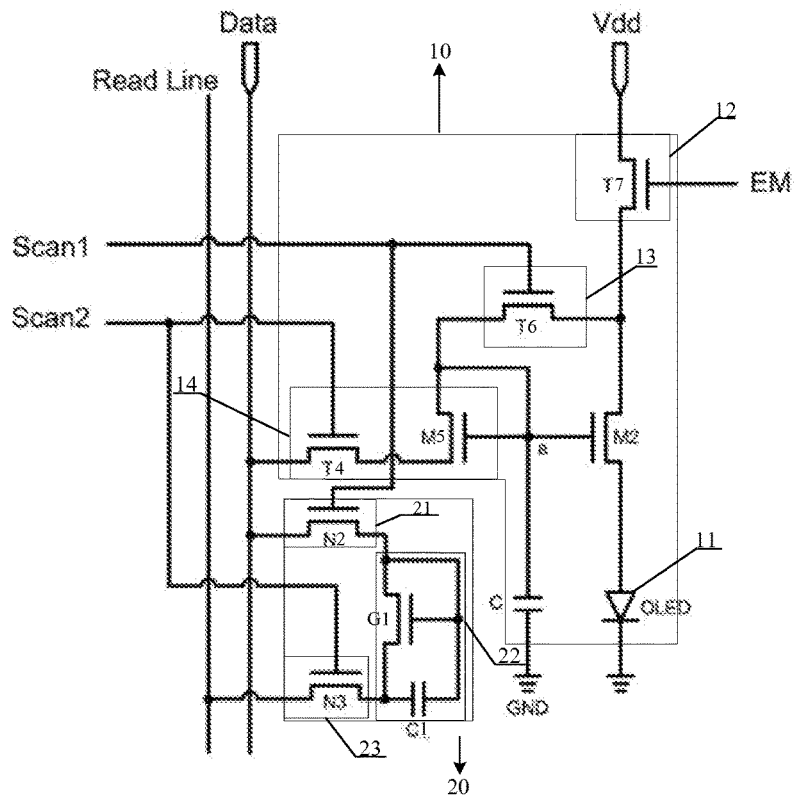
FIG. 4 is a schematic diagram of a pixel circuit provided by another embodiment of the present disclosure.

An embodiment of the present disclosure provides a pixel circuit, as shown in FIG. 4, and it differs from the one in the first embodiment in the following.

The compensation module 14 in the display unit 10 of the present embodiment comprises a fourth transistor T4 and a fifth transistor T5. A first terminal of the fourth transistor T4 is connected to the data signal line Data, a second terminal of the fourth transistor T4 is connected to a first terminal of the fifth transistor T5, a control terminal of the fourth transistor T4 is connected to the second control signal line Scan2; a second terminal of the fifth transistor T5 is connected to a control terminal of the fifth transistor T5 and connected to the control terminal of the driving transistor M2.

The precharging module 13 in the present embodiment is a sixth transistor T6, and the power switch module 12 is a seventh transistor T7. A first terminal of the seventh transistor T7 is connected to the operating voltage input terminal, the light emitting control signal EM is inputted into a control terminal of the seventh transistor T7, a second terminal of the seventh transistor T7 is connected to a first terminal of the sixth transistor T6; the second terminal of the sixth transistor T6 is connected to the control terminal of the driving transistor M2 and also to the second terminal and control terminal of the fifth transistor T5, and the control terminal of the sixth transistor T6 is connected to the first control signal line Scan1.

It differs from the one in the first embodiment also in that the touch control unit 20 in the present embodiment is for example a photo-sensitive touch control unit, which can realize photo-sensitive touch control a photo-sensitive touch control. As an example, the touch control unit 20 in the present embodiment comprises a touch control module 22 which is a photo-sensitive touch control module and includes a photo-sensitive transistor G1 and a first capacitor C1; a initialization module 21 which is a second TFT N2; and a output control module 23 which is a third TFT N3. A first terminal of the photo-sensitive transistor G1 is connected to a control terminal of the photo-sensitive transistor G1 and a first terminal of the first capacitor C1, and is connected as the input terminal of the touch control module 22 to a second terminal of the second TFT N2; a second terminal of the photo-sensitive transistor G1 is connected to a second terminal of the first capacitor C1, and is connected as the output terminal of the touch control module 22 to a first terminal of the third TFT N3; a first terminal of the second TFT N2 is connected to the data signal line Data, a control terminal of the second TFT N2 is connected to the first control signal line Scan1; a second terminal of the third TFT N3 is connected to the signal read line Read line, and a control terminal of the third TFT N3 is connected to the second control signal line Scan2.

Compared with capacitive touch control, the photo-sensitive touch control is to sense the position of a touch point based on the changes of light intensity. In addition that they have the same touch control sensitivity, the advantage of the photo-sensitive touch is that it is not limited by the dimension of the module. The capacitive touch control uses in cell (built-in) technology, it is difficult to solve the problems of display signal interference and the RC-Loading (signal delay) issues due to narrow frames. For example, there is a relatively large parasitic capacitance between the touch control electrode and the electrode required when a display device such as a liquid crystal display operates. In addition, with the trend of narrow frames, it is difficult for the distribution of the resistances of lines to meet the requirements. Theses problems as well as the problem of how to smoothly collect the touch control signal in the case of a strong electric field interference without the touch control electrodes affecting the display characteristics of the display device itself are difficult to overcome in the field filed.

The pixel circuit in the present embodiment comprises the display unit 10 and the touch control unit 20. The touch control unit 20 is a photo-sensitive touch control unit. The photo-sensitive transistor G1 in the touch control unit 20 is a photo-sensitive TFT. When light irradiates on the photo-sensitive TFT, it will produce a photocurrent, and different light intensities will produce photocurrents of different intensities. The second transistor N2 and the third transistor N3 are switching TFTs which play a role in controlling the controllable switch. In addition, there is the first capacitor C1 which is used to store the photocurrent generated by the photo-sensitive transistor G1. In the display unit 10, the fourth transistor T4, the sixth transistor T6 and the seventh transistor T7 are switching TFTs. The drive transistor M2 and the fifth transistor M5 operates in the saturation region and are driving TFTs. In addition, it further comprises the storage capacitor C.

For the entire signal circuit, the first control signal line Scan1, the second control signal line Scan2, and the light emitting control signal line EM are signal input lines, and control the turning on and off of the display unit 10 and TFT switches within the touch control unit 20 respectively. The second control signal line Scan2 and the signal read line Read Line in the touch control unit 20 determine the coordinates of the touch position, wherein the second control signal line Scan2 is used to determine the coordinate in the Y direction which is parallel to the data signal line Data, and the signal read line Read Line is used to determine the coordinate in the X direction which is perpendicular to the data signal line Data.

Figure 5:
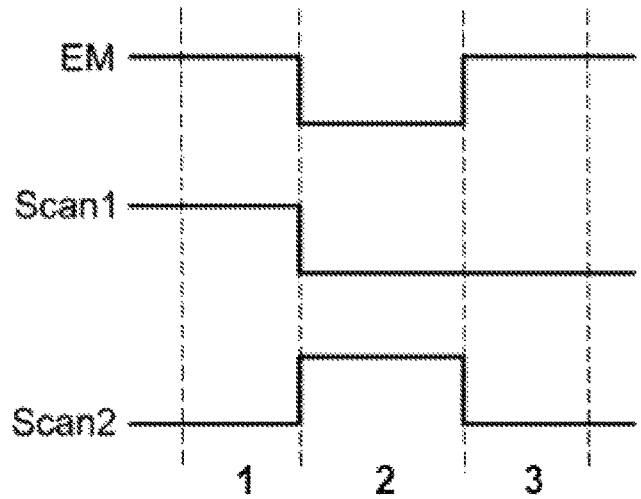
FIG. 5 is a time sequence diagram of the pixel circuit shown in FIG. 4.

FIG. 5 is a time sequence diagram of the pixel circuit shown in FIG. 4. In the following, the respective process of the entire pixel circuit will be described one by one in connection with FIG. 5. In order to facilitate understanding, in each phase, the operating process of the display unit 10 and the touch control unit 20 will be described separately, but in practice, the actual operating processes of the two are performed simultaneously. In this embodiment, the operating process of the pixel circuit comprises three phases as follows.

In the first phase, regarding the touch control unit 20, as can be seen from section 1 in the time sequence of FIG. 5, the first control signal line Scan1 is pulled up, the second transistor N2 is turned on, and the third transistor N3 is turned off. In this phase, the data signal is input, the first terminal of the first capacitor C1 and the first terminal and the control terminal of the photo-sensitive transistor G1 are reset to prepare for the next phase of the signal collection. Regarding the display unit 10, section 1 in the time sequence diagram is a charging phase, in this situation, T6 and T7 are turned on, T4 is turned off, the signal of the operating voltage input terminal Vdd begins to charge point a through T6, and the potential of point a remains to be Vdd.

In the second phase, regarding the touch control unit 20, as can be seen from section 2 in the time sequence of FIG. 5, the second control signal line Scan2 is pulled up, N3 is turned on. G1 is a photo-sensitive TFT with its gate and source connected, and goes through its own potential conversion. In this situation, the potential difference stored in C1 is a constant value. When light irradiates here, the light intensity received by the photo-sensitive transistor G1 increases, then the voltage signal is temporarily stored in one terminal of C1. Since the illumination effect causes the charging current of the photo-sensitive transistor G1 to be increased, when N3 is turned on, then this signal is transmitted through the signal read line Read line to a amplifier at the end terminal, and the amplified signal is transmitted to the processor for data calculation and analysis; if a touch action occurs during this period, the difference of the photoelectric signal strengths before and after the touch is compared with a threshold value for no touch action, thereby determining whether there is a touch (i.e., light intensity variation). The coordinate in the Y direction which is parallel to the data signal line Data is determined by the output point of the second control signal line Scan2 at this time, and the coordinate in the X direction which is perpendicular to the data signal line Data is determined by the signal read line Read Line. Up to now, the position coordinates of the touch point are determined.

Regarding the display unit 10, in this situation, T4 is turned on, T6 and T7 are turned off. The signal Vdata on the data signal line Data will recharge point a through M5, and the potential of point a changes from the original potential of the operating voltage Vdd to Vth1+Vdata (at this time, the voltage difference between the gate and the source of M5 is Vth1), that is, the compensated data signal is written into the first capacitor C1 to prepare for the next phase. The potential of point a at this time is Va=Vth1+Vdata.

In the third phase, regarding the touch control unit 20, as can be seen from section 3 in the time sequence of FIG. 5, the first control signal line Scan1 and the second control signal line Scan2 are pulled down. Therefore in this phase, N2 and N3 are turned off, the touch control unit 20 is not operating and in a standstill state (or turned-off state). This phase corresponds to the light emitting process of the display unit 10, so its impact on the display unit 10 is small.

Regarding the display unit 10, the light-emitting element 11 in the present embodiment is an OLED. As can be seen from FIG. 5, section 3 in the time sequence diagram corresponds to the formal light-emitting phase of pixels of AMOLED. In this light-emitting phase, T6 and T4 are both turned off, T7 is turned on, the potential of the source (the first terminal) of the driving TFT M2 is connected to the operating voltage Vdd, and the current flows through T7 and make the OLED start to emit light via M2.

It can be derived from the saturation current equation of TFT: $I_{OLED}=K(V_{GS}-Vth2)^2$, where $I_{OLED}$ is the saturation current of M2, Vth2 is the threshold voltage of M2, $V_{GS}$ is the voltage difference between the gate and the source of M2, and $V_{GS}=Va-V_{OLED}$.

Putting Va=Vth1+Vdata into the above equation yields:

$$I_{OLED}=K(V_{GS}-Vth2)^2=K(Va-V_{OLED}-Vth2)^2$$

$$=K[(Vdata+Vth1)-V_{OLED}-Vth2]^2$$

$$=K(Vdata-V_{OLED})^2$$

In the above equation, Vth1 and Vth2 are the threshold voltages of M5 and M2 respectively. According to the principle of mirror circuit, it is deemed that Vth1 is approximately equal to Vth2, i.e., Vth1=Vth2. Vdata is the data voltage, $V_{OLED}$ is anode voltage of the light-emitting element 11 (OLED). As can be seen from the above equation, the operating current $I_{OLED}$ is not influenced by Vth anymore, and therefore the problem of threshold voltage (Vth) drift of the driving transistor due to process technology and long operation is solved, eliminating its impact on $I_{OLED}$ to ensure the normal operation of the OLED.

The pixel circuit of the present embodiment provides a pixel structure design of in cell photo-sensitive touch control module, which not only includes the compensation circuit for AMOLED display, but also adds the photo-sensitive touch control unit. It can not only compensate for the threshold voltage drift of the driving transistor, improve the uniformity of the brightness of the display panel, but also integrate the functions of light-emitting display and touch control, achieving the purpose of simplifying operations and manufacturing processes. Display panel or device employing the above-mentioned pixel circuit can achieve the functions of light-emitting display and photo-sensitive touch control simultaneously.

Optionally, all the transistors N2, N3, T4, T6, T7, M2 and M5 in the above pixel circuit have the same channel type such as N type. Unification of process technology of transistors helps to improve product yield. Alternatively, LTPS (low temperature poly-silicon) process technology can be employed at preparation.

In the embodiments of the present disclosure, the transistors are all N type TFTs, but the type (i.e., whether each transistor is of N type or P type, whether each transistor is of depletion type or enhancement type) of the transistor can not be used to limit the pixel circuit. The type selection changes and connection changes due to the type selection changes of respective transistors made by the skilled in the art without creative effort also fall within the scope of protection of the present disclosure.

For example, as in the time sequence diagram shown in FIG. 5, Scan2 and light emitting control signal EM are always symmetrical inverted, and the states (turned on/turned off) of the sixth transistor T6 and the seventh transistor T7 in FIG. 4 are always the opposite, it is possible to reduce one signal line by changing the type selection of transistors (P type and N type). For example, it is possible to set the channel type of the seventh transistor and the channel type of the fourth transistor to be of opposite types, and the control terminal of the seventh transistor can control by using the second control signal line Scan2 without setting the light emitting control signal line.

Figure 6:
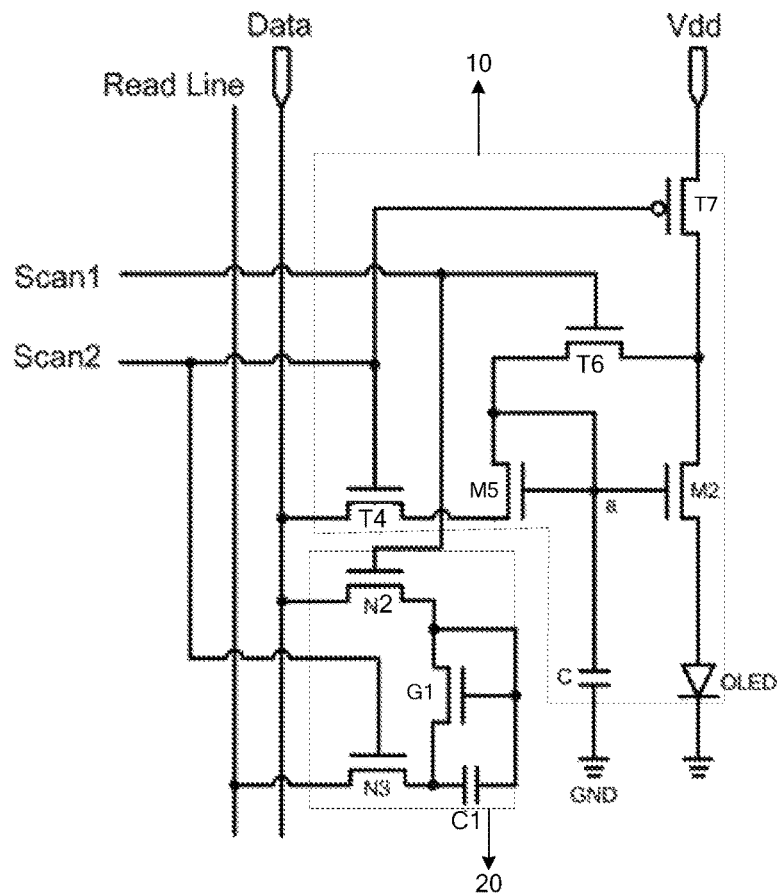
FIG. 6 is a variation of a pixel circuit provided by another embodiment of the present disclosure.
Figure 7:
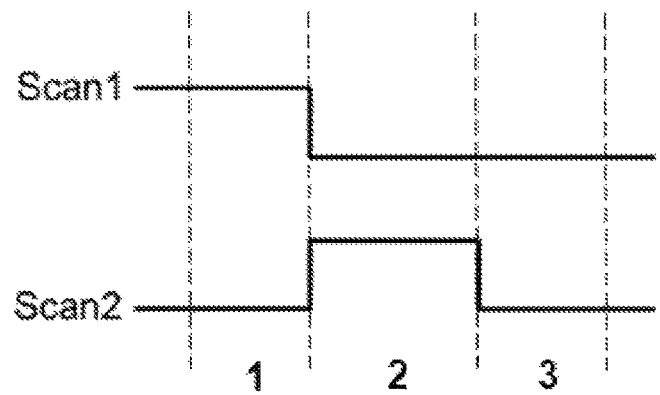
FIG. 7 is a time sequence diagram of the pixel circuit shown in FIG. 6.

FIG. 6 shows a variation of a pixel circuit of an embodiment of the present disclosure. It differs from the pixel circuit shown in FIG. 4 in that the seventh transistor T7 of the pixel circuit is a P type transistor, and all the other transistors except the seventh transistor T7 are N type transistors. The seventh transistor T7 is a P type transistor with its control terminal connected directly to the second control signal line Scan2. FIG. 7 shows a time sequence diagram of the pixel circuit. The present pixel circuit requires only two control signal lines of Scan1 and Scan2.

The present embodiment make the control signal line of the compensation unit compatible with the switch control signal line of the touch control unit, etc. It realizes efficient integration of functions of AMOLED display and in cell photo-sensitive touch control through reusing signal lines, improving added value of product.

Figure 8:
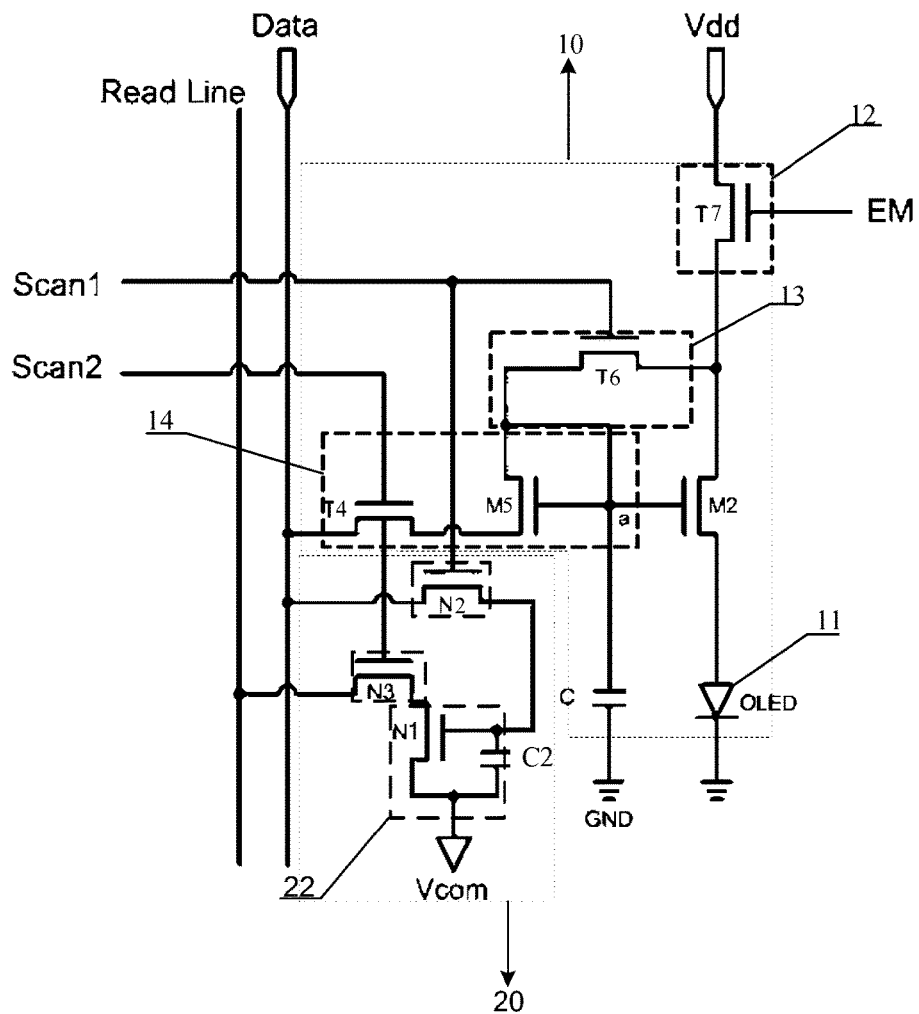
FIG. 8 is a schematic diagram of a pixel circuit provided by another embodiment of the present disclosure.

An embodiment of the present disclosure provides a pixel circuit as shown in FIG. 8, which is substantially similar to the pixel circuit shown in FIG. 4 in the second embodiment. The difference lies only in that the touch control module 22 in the touch control unit 20 is a capacitive touch control module which comprises a first transistor N1 and a second capacitor C2. A control terminal of the first transistor N1 is connected to a first terminal of the second capacitor C2, and is connected to the initialization module 21 (the second transistor N2) as the input terminal of the touch control module 22, a second terminal of the first transistor N1 is connected to the output control module 23 as the output terminal of the touch control module 22, a first terminal of the first transistor N1 is connected to a common voltage input terminal Vcom.

The operation time sequence of the pixel circuit in the present embodiment is shown in FIG. 5, like the second embodiment, its operating principle and process are substantially the same as the pixel circuit shown in FIG. 4. For simplicity, here only outlines its operating process.

In the first phase, as can be seen from section 1 in the time sequence of FIG. 5, Scan1 is pulled up, N2 in the touch control unit 20 is turned on, and N3 is turned off. In this phase, the data signal is inputted, the first terminal of the second capacitor C2 and the control terminal of N1 are reset to prepare for the next phase of the signal collection. Regarding the display unit 10, section 1 in the time sequence diagram is a charging phase, in this situation, T6 and T7 are turned on, T4 is turned off, the operating voltage Vdd begins to charge point a through T6, and the potential of point a remains to be Vdd.

Figure 10:
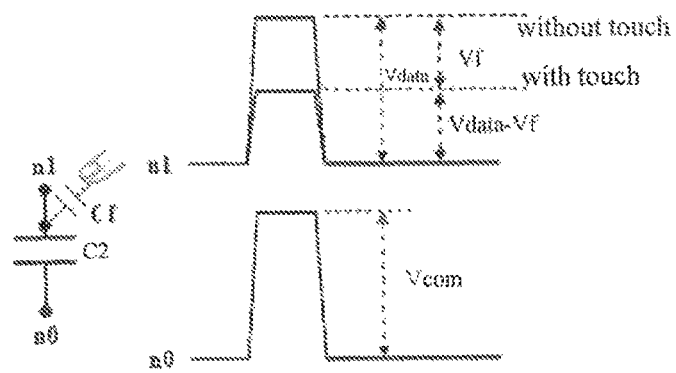
FIG. 10 is a schematic diagram showing the potential change of a detection electrode when a finger touches it in another embodiment of the present disclosure.

In the second phase, regarding the touch control unit 20, as can be seen from section 2 in the time sequence of FIG. 5, the second control signal line Scan2 is pulled up, N3 is turned on. A touch of a finger on the detecting electrode D (upper plate of C2) will directly cause potential reduction of node n1 (the control terminal of N1), as shown in FIG. 10. In this situation, the potential of the node n1 is reduced to Vdata−Vf, where Vf is the potential reduction due to the touch. Although the potential of node n1 will reduce, but it still makes the gate-source voltage of N1 meet the turn-on condition, that is, Vdata−Vf>Vth1; the current flows through N1 and N3, and eventually received by the read line Read Line. The signal received at this time is reduced compared with the current when there is no touch, thereby the touch point is identified. FIG. 10 shows the potential changes of node n1 on the upper plate and node n0 on the lower plate of the second capacitor C2.

Regarding the display unit 10, in this situation, T4 is turned on, T6 and T7 are turned off. The signal Vdata on the data signal line Data will recharge point a through M5, and the potential of point a changes from the original potential of the operating voltage Vdd to Vth1+Vdata, that is, the compensated data signal is written into the first capacitor C1 to prepare for the next phase. The potential of point a at this time is Va=Vth1+Vdata.

In the third phase, regarding the touch control unit 20, as can be seen from section 3 in the time sequence of FIG. 5, the first control signal line Scan1 and the second control signal line Scan2 are pulled down. Therefore in this phase, N1 to N3 are turned off, not operating and in a standstill state (or off state). This phase corresponds to the light emitting process of the display unit 10, so its impact on the display unit 10 is the smallest. The current flowing through light-emitting element 11 is $I_{OLED}=K(Vdata-V_{OLED})^2$, which is independent from the threshold voltage of M2.

The present embodiment provides a pixel structure design of a in cell capacitive touch control display module. The pixel not only includes the compensation circuit for AMO-LED display, but also adds the capacitive touch control unit. It can not only compensate for the threshold voltage drift of the driving transistor, improve the uniformity of the brightness of the display panel, but also integrate the touch control module into the pixel circuit without increasing the complexity of the circuit structure and operation, achieving the purpose of simplifying operations and manufacturing processes.

Optionally, all the transistors N1, N2, N3, T4, T6, T7, M2 and M5 in the above pixel circuit have the same channel type such as N type. Unification of process technology of transistors helps to improve product yield. LTPS (low temperature poly-silicon) process technology can be employed at preparation simultaneously to further simplify manufacturing processes and improve product yield.

In the embodiments of the present disclosure, the transistors can all be N type TFTs, but the type selection changes and connection changes due to the type selection changes of respective transistors made by the skilled in the art without creative effort also fall within the scope of protection of the present disclosure.

Figure 9:
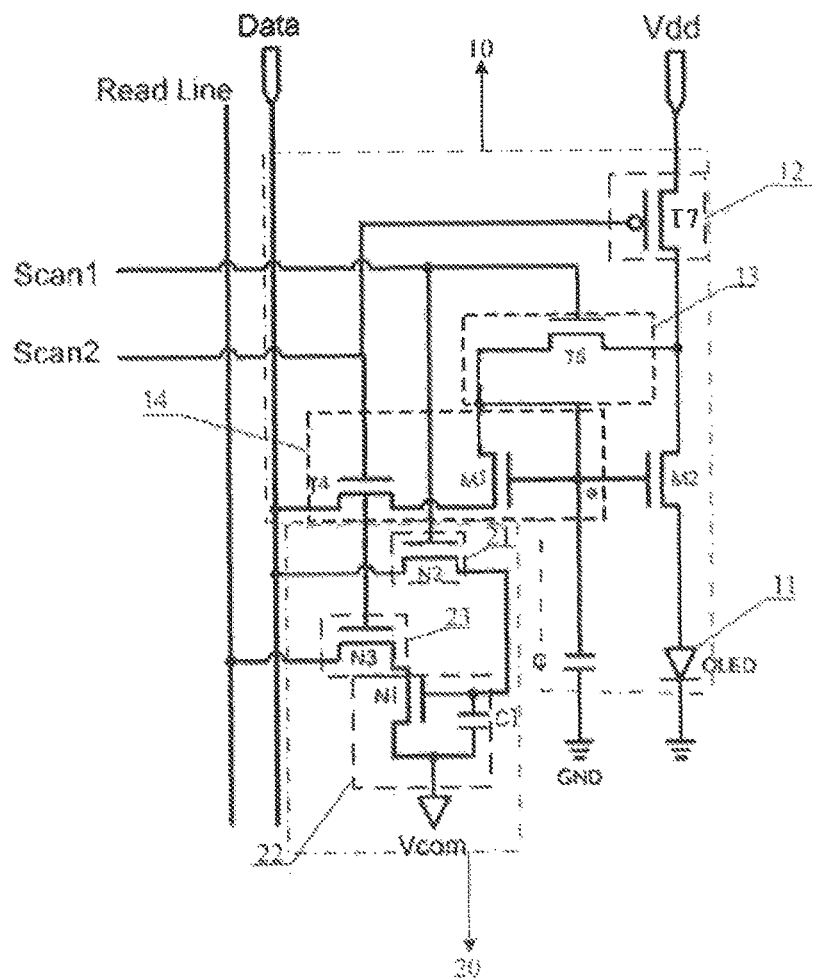
FIG. 9 is a variation of a pixel circuit provided by another embodiment of the present disclosure.

Similar to the first embodiment, there is also a variation for the pixel circuit of the present embodiment. As shown in FIG. 9, the seventh transistor T7 of the pixel circuit is set to be a P type transistor, and all the other transistors except the seventh transistor T7 are set to be N type transistors. In this situation, the control terminal of the seventh transistor T7 is connected directly to the second control signal line Scan2, and there is no need to set the light emitting control line EM, thus saving one control signal line. FIG. 7 shows a time sequence diagram of the pixel circuit.

The embodiments of the present disclosure provide a design for a pixel structure with a built-in capacitive touch control module, in which a display unit uses a design of 5T1C (5 TFTs and 1 capacitor). It can solve the problem of non-uniformity of threshold voltages (Vth) of driving transistors of pixel points due to process technology and long operation, so that the current flowing through each pixel point is not affected by the threshold voltage, and ultimately ensure the uniformity of image display. The pixel structure design of the present embodiment can also ensure that there is no current flowing through the light-emitting element (OLED) in the entire process except the light-emitting phase, which indirectly improve the life span of the light-emitting elements.

The present embodiment realizes the efficient integration of the functions of light-emitting display and capacitive touch control through reusing signal lines such as the control signal lines and data signal line Data of the compensation circuit as well as the control signal lines and initialization signal line of the capacitive touch control unit without increasing the complexity of the circuit structure and operation, achieving the purpose of simplifying operations and manufacturing processes.

The present disclosure also provides a display apparatus which is provided with the any of the pixel circuits described above in the first to the third embodiments. The display apparatus here can be any product or means with display function such as an electronic paper, a OLED panel, a cell phone, a tablet, a TV set, a display, a notebook computer, a digital photo frame, a navigator and so on.

Figure 11:
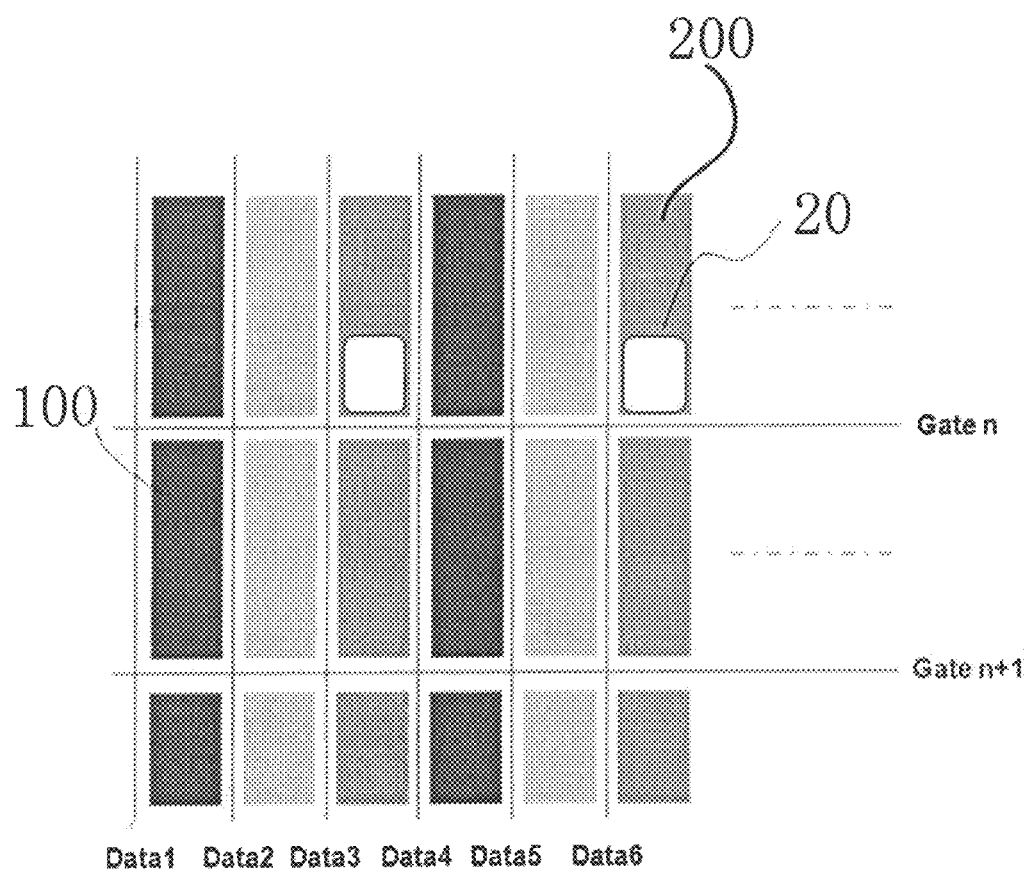
FIG. 11 is a schematic diagram of pixel arrangement in a display apparatus provided by another embodiment of the present disclosure.

The display apparatus of the present embodiment introduces the touch control function into the display area of the display apparatus, achieving the functions of light-emitting display and touch control simultaneously. For example, the touch control modules are commonly disposed in a way that they are periodically implanted in the pixels of the display area. As shown in FIG. 11, each pixel circuit 200 which has a built-in touch control module is a touch control point. The periodical distribution manner, distribution density or pitch of the touch control modules 22 can be designed according to the actual conditions (e.g., design requirements of touch control points), which will not be limited by the embodiment. Other pixels can adopt the form of the pixel circuit 100 with only display unit.

The display apparatus of the present embodiment has a good uniformity of brightness, and meanwhile integrates the module for realizing the function of touch control in the pixel circuit without increasing the complexity of the circuit structure and operation, achieving the purpose of simplifying operations and manufacturing processes.

The technical features disclosed in the embodiments of the present disclosure can be used in any combination without conflict.

In order to facilitate clear description, in the present disclosure, word expressions such as the first, the second and so on are used to distinguish between similar items. The word expressions such as the first and the second are not to limit the present disclosure in quantity, but only for an exemplary description of the preferred ways. Similar variations or related developments conceived by the skilled in the art based on the disclosure of the present disclosure all fall within the scope of the present disclosure.

This embodiments in the present specification are described in a progressive way. Like parts or identical parts among the various embodiments can refer to each other. Every embodiment highlights the difference between the present embodiment and other embodiments. In particular, regarding the method embodiments, the description was relatively simple, and relevant parts can refer to the corresponding ones of the device embodiments.

It will be appreciated by those of ordinary skill that all or part of the processes of the methods in the above-described embodiments can be accomplished through a computer program instructing relevant hardware, the program may be stored in a computer readable storage medium, when executed, the program may include processes of the processes of the above-described method embodiments. The storage medium may be a magnetic disk, an optical disk, a ROM (a Read-Only Memory), or a RAM (Random Access Memory) and the like.

The above descriptions are only specific implementations of the present disclosure, but the protection scope of the present disclosure is not limited thereto. Variations and replacements readily conceived of by those skilled in the art within the technical scope disclosed in the present disclosure should fall within the protection scope of the present disclosure. Therefore, the protection scope of the present disclosure should be subject to the scope of the claims.

The present application claims the priority of Chinese Patent Application No. 201410425976.3 filed on Aug. 26, 2014, entire content of which is incorporated as part of the present invention by reference.

What is claimed is:

1. A pixel circuit comprising a display unit and a touch control unit, wherein
the display unit comprises a light-emitting element, a driving transistor, a storage capacitor, a power switch module, a precharging module and a compensation module, the precharging module comprising a sixth transistor and being configured to charge a control terminal of the driving transistor, an operating voltage of the control terminal of the driving transistor being maintained by the storage capacitor so that a conduction state is maintained between the compensation module and the storage capacitor, the compensation module comprising a fourth transistor and a fifth transistor and being configured to compensate a data signal and write the compensated data signal into the storage capacitor, the power switch module comprising a seventh transistor and being configured to input an operating voltage into the driving transistor after the data signal is written into the storage capacitor, the driving transistor being configured to use the data signal stored in the storage capacitor to drive the light-emitting element to emit light, and wherein
the touch control unit comprises an initialization module, a touch control module and an output control module, the initialization module comprising a second transistor and being configured to initialize the touch control module while the precharging module is operating, the touch control module comprising a transistor and a capacitor and being configured to collect touch control signals in corresponding regions, the output control module comprising a third transistor and being configured to close an output path to output the touch control signals collected by the touch control module while the compensation module is operating,
wherein the touch control module comprises a first transistor and a second capacitor, wherein a control terminal of the first transistor is connected to a first terminal of the second capacitor, and is connected to the initialization module, a second terminal of the first transistor is connected to the output control module, a first terminal of the first transistor and a second terminal of the second capacitor are both connected to a common voltage input terminal.

2. The pixel circuit according to claim 1, wherein one terminal of the light-emitting element is connected to a grounded terminal, and the other terminal of the light-emitting element is connected to a second terminal of the driving transistor; a first terminal of the driving transistor is connected to a second terminal of the power switch module, and a control terminal of the driving transistor is connected to a first terminal of the storage capacitor; a first terminal of the power switch module is connected to an input terminal for the operating voltage, and a light emitting control signal is inputted into a control terminal of the power switch module; a second terminal of the storage capacitor is connected to the grounded terminal; the precharging module is connected to the second terminal of the power switch module, the control terminal of the driving transistor and a first control signal line; the compensation module is connected to a data signal line, the control terminal of the driving transistor and a second control signal line.

3. The pixel circuit according to claim 2, wherein the initialization module is connected to an input terminal of the touch control module, the first control signal line and an initialization signal line; the output control module is connected to an output terminal of the touch control module, the second control signal line and a signal read line.

4. The pixel circuit according to claim 3, wherein the touch control module is a photo-sensitive touch control module or a capacitive touch control module.

5. The pixel circuit according to claim 3, wherein the touch control module comprises a photo-sensitive transistor and a first capacitor, wherein
a first terminal of the photosensitive transistor is connected to a control terminal of the photo-sensitive transistor and a first terminal of the first capacitor, and is connected to the initialization module as the input terminal of the touch control module; a second terminal of the photo-sensitive transistor is connected to a second terminal of the first capacitor, and is connected to the output control r module as the output terminal of the touch control module.

6. The pixel circuit according to claim 3, wherein
a control terminal of the first transistor is used as the input terminal of the touch control module, a second terminal of the first transistor is used as the output terminal of the touch control module.

7. The pixel circuit according to claim 5, wherein a first terminal of the fourth transistor is connected to the data signal line, a second terminal of the fourth transistor is connected to a first terminal of the fifth transistor, a control terminal of the fourth transistor is connected to the second control signal line; a second terminal of the fifth transistor is connected to a control terminal of the fifth transistor and connected to the control terminal of the driving transistor.

8. The pixel circuit according to claim 7, wherein all the transistors have the same channel type.

9. The pixel circuit according to claim 7, wherein the channel type of the seventh transistor is opposite to that of the fourth transistor, a control terminal of the seventh transistor is connected to the second control signal line.

10. A display apparatus comprising the pixel circuit according to claim 1.

11. A driving method of a pixel circuit according to claim 1 comprising
the precharging module charging a control terminal of the driving transistor, so that the potential of the control terminal becomes an operating voltage, the state is maintained under the effect of the storage capacitor, a conduction state is maintained between the compensation module and the storage capacitor, and meanwhile the initialization module in the touch control unit initializes the touch control module;
the compensation module compensating a data signal, loading the compensated data signal onto the control terminal of the driving transistor and writing the same into the storage capacitor, and meanwhile the output control module in the touch control unit closing an output path to output the touch control signals collected by the touch control unit to a signal read line;

turning off the touch control unit while the power switch module is turned on, inputting the operating voltage into the driving transistor, and the driving transistor using the data signal stored in the storage capacitor to drive the light-emitting element to emit light.

12. The display apparatus according to claim 10, wherein one terminal of the light-em ting element is connected to a grounded terminal, and the other terminal of the light-emitting element is connected to a second terminal of the driving transistor; a first terminal of the driving transistor is connected to a second terminal of the power switch module, and a control terminal of the driving transistor is connected to a first terminal of the storage capacitor; a first terminal of the power switch module is connected to an input terminal for the operating voltage, and a light emitting control signal is inputted into a control terminal of the power switch module; a second terminal of the storage capacitor is connected to the grounded terminal; the precharging module is connected to the second terminal of the power switch module, the control terminal of the driving transistor and a first control signal line; the compensation module is connected to a data signal line, the control terminal of the driving transistor and a second control signal line.

13. The display apparatus according to claim 12, wherein the initialization module is connected to an input terminal of the touch control module, the first control signal line and an initialization signal line; the output control module is connected to an output terminal of the touch control module, the second control signal line and a signal read line.

14. The display apparatus according to claim 13, wherein the touch control module is a photo-sensitive touch control module or a capacitive touch control module.

15. The display apparatus according to claim 13, wherein the touch control module comprises a photo-sensitive transistor and a first capacitor, wherein a first terminal of the photo-sensitive transistor is connected to a control terminal of the photo-sensitive transistor and a first terminal of the first capacitor, and is connected to the initialization module as the input terminal of the touch control module; a second terminal of the photo-sensitive transistor is connected to a second terminal of the first capacitor, and is connected to the output control module as the output terminal of the touch control module.

16. The display apparatus according to claim 13, wherein the touch control module comprises a first transistor and a second capacitor, wherein a control terminal of the first transistor is connected to a first terminal of the second capacitor, and is connected to the initialization module as the input terminal of the touch control module, a second terminal of the first transistor is connected to the output control module as the output terminal of the touch control module, a first terminal of the first transistor and a second terminal of the second capacitor are both connected to a common voltage input terminal.

* * * * *